United States Patent
Stapleton

[19]

[11] Patent Number: 6,167,363
[45] Date of Patent: Dec. 26, 2000

[54] DESIGN FOR A SIMULATION MODULE USING AN OBJECT-ORIENTED PROGRAMMING LANGUAGE

[75] Inventor: Warren G. Stapleton, San Jose, Calif.

[73] Assignee: Advanced Micro Devices, Inc., Santa Clara, Calif.

[21] Appl. No.: 09/052,897

[22] Filed: Mar. 31, 1998

Related U.S. Application Data

[62] Division of application No. 08/592,041, Jan. 26, 1996, Pat. No. 5,870,585.
[60] Provisional application No. 60/005,045, Oct. 10, 1995.
[51] Int. Cl.[7] .................................................. G06F 17/50
[52] U.S. Cl. ...................... 703/14; 716/2; 716/3; 716/4; 703/4
[58] Field of Search ...................... 395/500.02, 500.05, 395/500.06, 500.07, 500.08, 500.35, 500.36, 500.37, 500.19, 500.34; 703/13, 14, 15, 16; 716/1–3, 4, 5, 6, 7, 18

[56] References Cited

U.S. PATENT DOCUMENTS

| | | | |
|---|---|---|---|
| 5,537,330 | 7/1996 | Damiano et al. | 364/489 |
| 5,546,562 | 8/1996 | Patel | 395/500 |
| 5,572,437 | 11/1996 | Rostoker et al. | 395/500.19 |
| 5,600,579 | 2/1997 | Steinmetz, Jr. | 364/578 |
| 5,668,732 | 9/1997 | Khouja et al. | 364/483 |

OTHER PUBLICATIONS

Pype, "News is Good on Behavioral Synthesis", Electronic Engineering Times, p. 40, Mar. 1995.
Jain, "A Comprehensive Pre–RTL IC Design Methodology", 1995 IEEE International Verilog HDL Conference, pp. 119–126, Mar. 1995.
Hi–Level Synthesis and Codesign Methods: an Application to a Videophone Codec, 1995, IEEE, Paulin et al., pp. 444–451.
A Smalltalk IV VLSI CAD Application, Ian Walker, Leeds Polytechnic, Apr. 1, 1991, pp. 47–53.
Tools and Techniques for Converting Simulation Models Into Test Patterns, Taylor, IEEE, Aug. 1993, pp. 133–138.
Object Oriented Simulation With Smalltalk–80 a Case Study, Drolet et al., 1991, pp. 312–322.

*Primary Examiner*—Kevin J. Teska
*Assistant Examiner*—Samuel Broda
*Attorney, Agent, or Firm*—Skjerven Morrill MacPherson LLP; Edward C. Kwok

[57] ABSTRACT

A register transfer level (RTL) model is created using an object-oriented programming language. In that RTL model, a logic circuit can be represented by a hierarchy of objects ("modules") each having representation of state elements, input signals, output signals and internal signals. Each object is also provided member functions for initializing, for loading a new state and for generating a next state. These modules are collected in a linked list. In the beginning of simulation, each object is initialized as the linked list is traversed. Then, a consistent next state for the RTL model is obtained by generating a state next based on the initial state. Simulation proceeds by alternately traversing the linked list to load a new state into each module, and traversing the linked list to generate the next state for each module. The step of traversing the linked list to generate the next state of each module may require multiple executions to ensure convergence.

3 Claims, 4 Drawing Sheets

DESIGN FOR A SIMULATION MODULE USING AN OBJECT-ORIENTED PROGRAMMING LANGUAGE

This Application is a divisional application of U.S. patent application Ser. No. 08/592,041, filed Jan. 26, 1996 now U.S. Pat. No. 5,870,585, which claims the benefit of priority of a copending provisional application entitled "EFFICIENT MODELING AND FAST FUNCTIONAL SIMULATION OF SEQUENTIAL DIGITAL LOGIC USING AN OBJECT ORIENTED PROGRAMMING LANGUAGE", provisional application No. 60/005,045, filed on Oct. 10, 1995.

CROSS REFERENCE TO APPENDIX INCLUDING A COMPUTER PROGRAM LISTING

Appendix A, which is a part of the present disclosure, is an appendix consisting of 3 sheets of listing of a computer program and related data in one embodiment of this invention. This listing of computer programs contains material which is subject to copyright protection. The copyright owner has no objection to the facsimile reproduction by anyone of the patent document or the present disclosure, as it appears in the Patent and Trademark Office patent files or records, but otherwise reserves all copyright rights whatsoever.

BACKGROUND OF THE INVENTION

1. Field of the Invention

The present invention relates to logic circuit representation; in particular, the present invention relates to a logic circuit representation which includes executable code that can be linked into a computer-aided design tool for simulation or verification.

2. Discussion of the Related Art

Conventional logic simulation tools and their associated hardware description languages (HDLs), which are often designed to accommodate a large number of diversed design styles, are not efficient in handling such complex logic circuits microprocessors. The overhead cost, i.e. the complexity of the simulator code and the associated memory requirements, renders these simulators too slow and requiring too much memory for handling the complexity of a microprocessor or a similar complex logic circuit.

In a conventional logic design methodology, a designer partitions a logic circuit under design into a hierarchy of functional blocks. Using a procedural programming language, such as the "C" language, well-known to those skilled in the art, the designer then writes simulation procedures for each functional block. Typically, in such a hierarchy, the lowest level procedures each compute a register transfer level (RTL) behavior of a small logic circuit. Simulation is achieved by executing this hierarchy of procedures for all clock periods during a prescribed simulation period. A design achieved with the help of such a simulation is then used to create a HDL description of the logic circuit. From this HDL description, an actual implementation of the logic circuit can be obtained using well-known methods, such as a logic synthesis tool. Because a conventional programming language does not provide data structures similar to those provided by a hardware description language, e.g. multiple instantiations of a circuit element, or a data structure customized for representing both an individual binary logic signal and a bus, creating an HDL description from these simulation procedures is often an undesirably complex and error-prone task.

Alternatively, simulation can be performed using an interpreter of the HDL used in the logic design. Many such interpreters are available, including those interpreting the Verilog HDL, well-known to those skilled in the art. However, in these simulators, since the HDL description is interpreted, the resulting simulation is too slow for use at the beginning stages of a design, when different design options are often simulated to provide a basis for a design decision. Thus, there is a need for a method for constructing logic simulation models which are expressed in data structures similar to those provided in HDLs and, at the same time, capable of being compiled with a simulator for simulation in a digital computer.

SUMMARY OF THE INVENTION

The present invention provides a method for simulating a logic circuit using an RTL model created using the facilities of an object-oriented programming language. The method of the present invention uses an object-oriented programming language to create a class of objects each representing a logic circuit. Each object of the class is provided constructs for representating input signals, output signals, state elements and internal signals. In addition, each object of the class is provided a function for initialization, a function for loading a new state, and a function for generating a next state. Using these objects ("modules"), an RTL model of the logic circuit can be created by instantiations of these objects. In some embodiments, it is desirable to have these modules organized in a hierarchical manner.

At the start of the simulation, each object is initialized using its function for initialization. Then, for each instantiation, the RTL model simulates the logic circuit by repeatedly applying, alternately, the function for loading a new state, and the function for generating a next state. To ensure each new state generated is consistent, the function for generating a next state is executed repeatedly for a predetermined number of times to ensure convergence. The function for loading a new state assigns values to state elements. The function for generating a next state assigns values to input signals, output signals, and internal signals values.

In one embodiment of the present invention, the object-oriented programming language C++ is used. In general, the RTL model is created as a source program, using the class of objects discussed above as building blocks. The source program is then transformed, i.e. compiled and linked, if necessary, into an executable program capable of being executed in a computer system.

In one embodiment of the present invention, the representations for input signals, output signals, state elements and internal signals are derived from a second class of objects, called the "vector" class. Each object in the vector class can be used to represent one or more signals. In this embodiment, created with this vector class of objects are functions and operators for extracting values of individual signals, extracting values of a selected group of signals, and operators for assigning, comparing, and summing objects of this vector class of objects.

In one embodiment of the present invention, the constructor for each module inserts a pointer to the module into a linked list. The linked list facilitates the simulator's access to the module.

In accordance with another aspect of the present invention, the method for simulating a logic circuit, includes the steps of: (a) initializing, in a predetermined order, each of the modules of the RTL model, (b) generating, in a predetermined order, a new state for each of the modules; and repeatedly applying the steps of: (i) loading, in the predetermined order, a new state for each module; and (ii) generating, in the predetermined order, the next state of each of the modules. Step (ii), in which the next states of the modules are generated in the predetermined order, can be executed multiple times to ensure convergence (i.e. to ensure that the RTL models constituting the overall RTL circuit model are consistent with each other).

Another aspect of the present invention provides a method for comparing a logic circuit's output signals, obtained under a register transfer level (RTL) model simulation circuit, are substantially the same as the corresponding output signals of the same logic circuit obtained under a hardware description language (HDL) model simulation. In this method, the RTL model simulation of the logic circuit and the corresponding HDL model simulation of the same logic circuit are started as different processes under the control of an operating system which supports an interprocess communication mechanism. Under this method, the simulation of each model is allowed to proceed one predetermined time period at a time. First, the RTL model simulation is run for that predetermined simulation time period using an input test vector. Upon completion of the RTL simulation for that predetermined simulation time period, values of output signals of the RTL model are retrieved. Then, the retrieved values of the output signals of the RTL model are sent, through the interprocess communication mechanism, to the process executing the HDL model simulation. Using the same test vector, the HDL model simulation is then run for the same predetermined simulation period. The output values from the HDL model simulation are then retrieved and compared with the values of the corresponding output signals of the RTL model simulation.

In one embodiment, the present invention is implemented on a UNIX-type operating system, e.g. Linux, which supports an interprocess communication mechanism known as "sockets".

The present invention provides a simulator that is tailored for use in the design of such complex logic circuits as a microprocessor. The simulator of the present invention is both fast and cycle-accurate. Because the simulator of the present invention is created from objects designed to be capable of being similarly expressed in an HDL description, translation from the RTL objects to the HDL-represented logic circuit can be efficiently performed.

The present invention is better understood upon consideration of the following detailed description and the accompanying drawings.

DETAILED DESCRIPTION OF THE PREFERRED EMBODIMENTS

The present invention provides a novel methodology for designing a complex logic circuit, as well as simulation modules which can be linked into a simulator for conducting in RTL level simulation of the logic circuit.

The present invention is applicable to logic circuit design activities typically carried out using an engineering workstation. The hardware configuration of such a workstation typically includes a high performance central processing unit (CPU), e.g. a high performance microprocessor of the industry standard x86 architecture, a mass storage system, a main memory system including one or more levels of data and instruction caching, and an input/output system which includes high resolution graphical input/output capabilities.

The software configuration of such a workstation includes an operating system with multi-tasking and interprocess communication capability, a logic simulator for simulating a logic circuit represented in a hardware description language (HDL), a compiler for an object-oriented programming language, a file system and a text editor. In the description of the present invention's various embodiments, the Linux operating system, a popular UNIX-type operating system, is selected as an example of an operating systems used in such a workstation. In Linux, as well as most UNIX-type operating systems, an interprocess communication mechanism called "sockets", described in further detail below, is supported to allow data to be passed between active processes or tasks in the operating system. The present invention can, of course, be practiced using other types of interprocess communication mechanisms, such as remote procedure calls. Interprocess communication mechanisms are well-known to those of ordinary skill in the art. In the embodiments described below, a logic circuit simulator capable of simulating a logic circuit represented in the Verilog HDL is assumed. Such a logic circuit simulator, which is available from, for example, Cadence Design Systems, Inc., is also well known in the art. The present invention is described below with reference to the object-oriented programming language "C++", although other object-oriented programming languages can be used. A description of the C++ programming language can be found in "The C++ Programming Language" by Bjarne Stroustrup, second edition, Addison-Wesley Publishing Co., 1992. Under the Linux operating system, programs written in the C++ programming language can be entered into source files of the file system using a text editor, such as the popular text editor EMACS. The C++ compiler compiles these source files into object codes which can be linked and executed by the CPU of the workstation.

Figure 1:
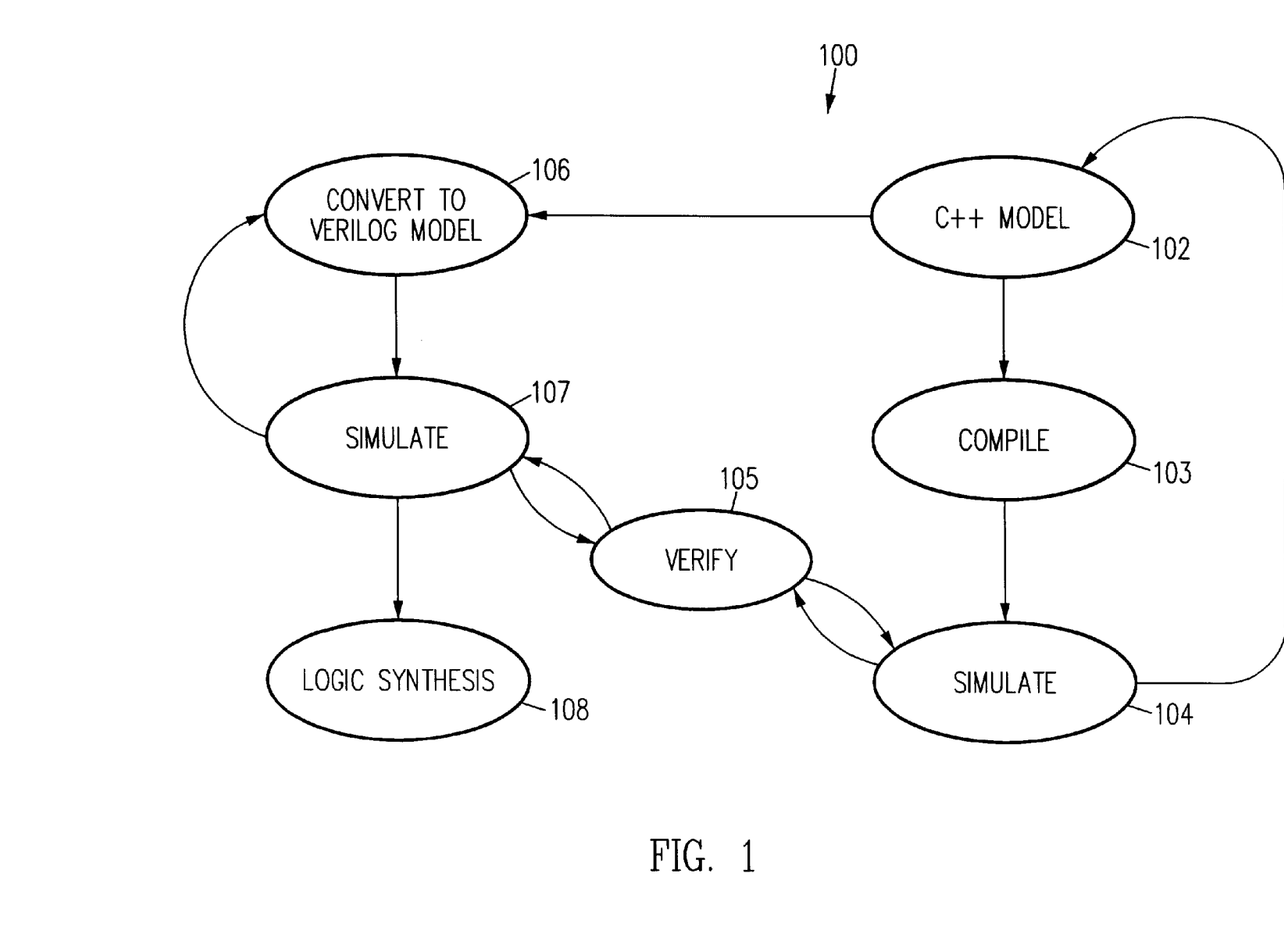
FIG. 1 is a flow diagram showing a method for designing a logic circuit, in accordance with the present invention.

FIG. 1 is a flow diagram 100 showing a method for designing a logic circuit, in accordance with the present invention. In the method illustrated in flow diagram 100, at step 102, a logic designer creates a register transfer level (RTL) model of a portion of the logic circuit, using an object-oriented programming language C++. The process of creating such an RTL model is described in further detail below. The RTL model is entered into a source file and then compiled, at step 103, into object code. At step 104, the object code is first linked with an RTL simulator, which is also described in further detail below, to form an executable simulator. The simulator is then executed, using a predetermined set of input stimuli ("test vectors"), which serve as input signals to the logic circuit at every simulated clock period. The output signals of the logic circuit at every simulated clock period, as computed by the simulator using the compiled RTL model, are then examined to verify the functionality of the logic circuit. If the RTL model is determined .(i) to be containing an error, (ii) to be needing additional components or (iii) for any reason, to be needing modification, steps 102, 103 and 104 are repeated until a satisfactory RTL model for the entire logic circuit is obtained.

Periodically during the reiteration of steps 102, 103 and 104, at step 106, the RTL model is converted into a logic circuit model ("HDL model") represented in the Verilog HDL. Conversion step 106 can be carried out at any time, without waiting until the RTL model for the entire logic circuit under design is complete. When conversion step 106 completes, the HDL model can be simulated, at step 107, by an industry standard Verilog simulator which interprets the HDL model, using test vectors similar to those described above with respect to the RTL simulator. At step 105, to verify that the HDL model is faithfully converted from the RTL model, the present invention provides a communication mechanism by which test vectors can be applied, in the same session, alternately to a simulation of the RTL model and a simulation of the HDL model. Thus, using this communication mechanism, the output signals of the HDL model simulation can be verified against the corresponding output signals of the RTL model simulation, at every clock period of the simulation period. Alternatively, step 105 can also be used to let the RTL model simulation drive, i.e. provides input stimuli, the HDL model simulation. This communication mechanism at step 105 for simultaneously simulating the RTL model and the HDL model is described with the help of FIG. 2 below. Upon satisfactory verification of the HDL model, a logic synthesis tool can then be used to translate the HDL model into an implementation of the logic circuit. Such an implementation can often be used to achieve the physical design used to fabricate the logic circuit in silicon.

Figure 2:
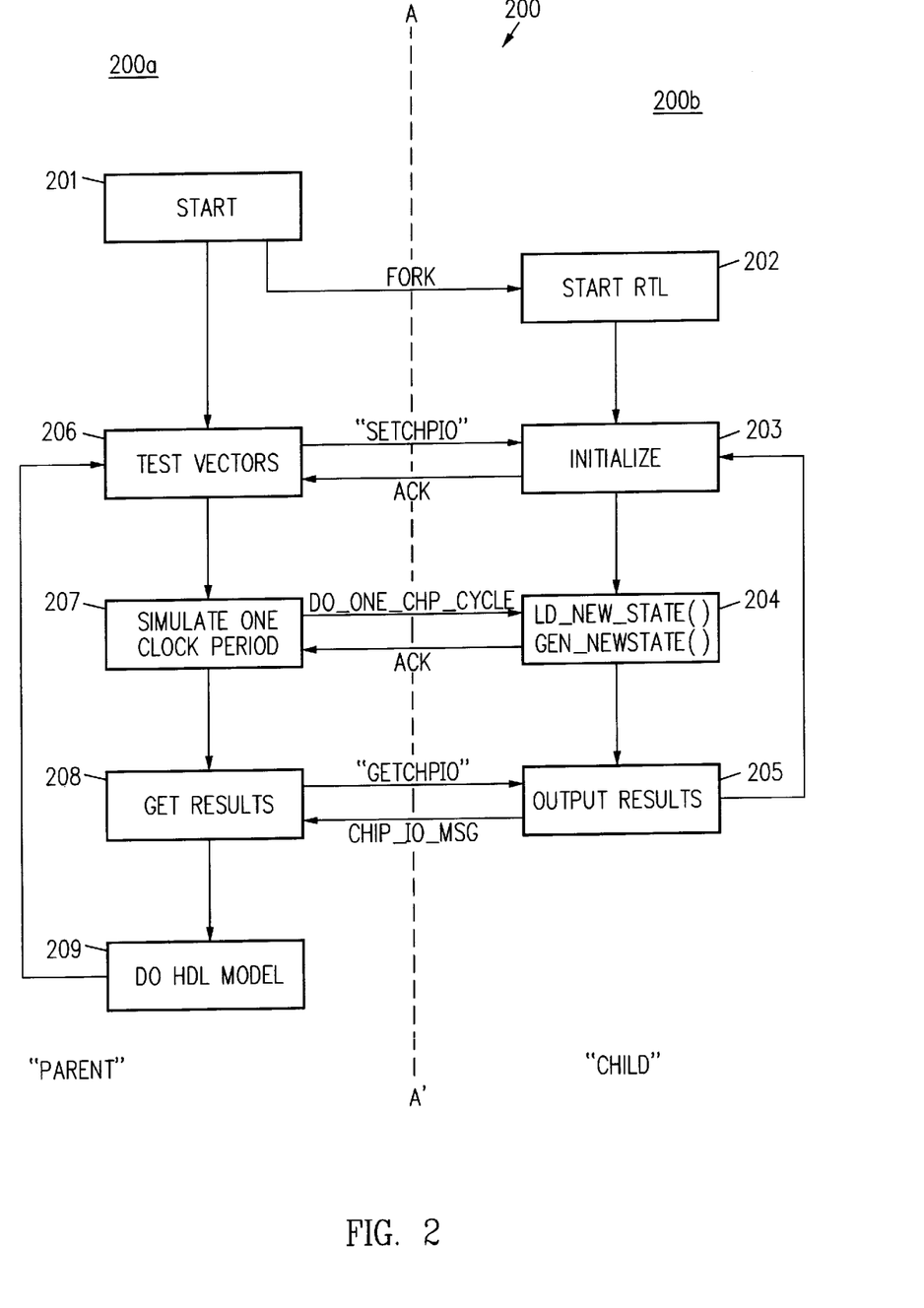
FIG. 2 is a flow diagram 200 showing the communication between the RTL model and a control program which monitors the simulation of the HDL model.

FIG. 2 is a flow diagram 200 showing the communication between the RTL model and a control program which monitors the simulation of the HDL model. As mentioned above, in this embodiment, the HDL model can be simulated, for example, under a Verilog logic simulator available from Cadence Design Systems, Inc., San Jose, Calif. The control program described here can interface with Cadence's Verilog simulator through a "PLI" interface (i.e. programming language interface). The PLI interface is familiar to those of ordinary skill in the art. As shown in FIG. 2, at step 201, a process ("parent process") 200a is created in the Linux operating system to control a simulation of the HDL model under the Verilog simulator. The steps 201, 206–209 represent steps to be executed in parent process 200a. At step 201, parent process 200b creates a connected pair of "sockets" by invoking a UNIX system procedure socketpair(). The socket is a well-known bidirectional communication mechanism under the UNIX operating system which allows two processes to communicate with each other. Under the socket mechanism, each process reads from and writes into an assigned socket. Data written into a process assigned socket can be read from the other process's assigned socket created in the manner described above. Parent process 200a then invokes a UNIX system procedure fork() to create a second process ("child process") 200b. Parent process 200a retains one of the two sockets created above and passes to the child process 200b the other socket of the socket pair created above. Child process 200b invokes the RTL model which, upon instantiation in the memory space of child process 200b, executes an initialization sequence and, at step 203, waits at its assigned socket for a message from parent process 200a. At step 206, parent process 200a writes into its assigned socket a message "SetChpIO" (i.e. informing the child process that a test vector to be applied on the input pins of the RTL model will be passed), which is received by child process 200b at the child process's assigned socket. Child process 200b then sends an acknowledgement message to parent processing 200a, indicating readiness to receive such a test vector. Upon receiving child process 200b's acknowledgement of receipt of this message, parent process 200a sends the test vector to child process 200b. Child process 200b then directs the RTL model to assign the received test vector to the input pins of the RTL model. Child process 200b then waits, at step 204, for the next message from parent process 200a.

At step 207, parent process 200a sends a "DoOneCycle" (i.e. simulate for one simulation clock period) message to child process 200b. Upon receiving this message, child process 200b directs the RTL model to execute one simulation clock period. As discussed in further detail below, the RTL model invokes every module in the model to simulate one clock period. Within each module, a procedure LdNewState() is executed. During the execution of LdNewState(), the state elements (e.g. registers) of the module, whose clock input signals are enabled, load a new state into the state elements. Based on the new state, the RTL model executes a procedure GenNewState(), which evaluates the remainder of the logic circuit to derive the next state of the logic circuit. Child process 200b then sends an acknowledgement indicating that the DoOneCycle message of parent process 200a is received and carried out.

Upon receiving the acknowledgement of the DoOneCycle message from child process 200b, parent process 200a sends child process 200b, at step 208, a "GetChpIO" (i.e. get input/output signals) message. Child process 200b then returns, at step 205, a message which contains the values of the requested output signals of the RTL model. At step 209, the output values of the RTL model, together with the test vector sent to the child process 200b at step 206 are provided to the HDL model simulation. The HDL model applies the test vector as input stimuli for the next simulation period, and compares the corresponding output signals from the HDL model simulation to the output signals received from the RTL model at step 205.

Appendix A includes an example of procedures written in the C++ programming language to implement the method described above. In Appendix A, child process 200b can be created by procedure h86_pipestart_calltf(), the input signals of the RTL model can be set by procedure h86_pipesetchpio_calltf(), the RTL model can be directed to simulate for one simulation clock period procedure by procedure h86_pipeinterate_calltf(), and the RTL model resulting output value of such simulation can be retrieved by procedure h86_pipegetchpio_calltf().

The RTL model of the present invention is provided as a global list of objects ("modules"), in which each module is derived from a base class module. Each module on the global list represents an RTL level model of a portion of the logic circuit to be simulated. The base class module is defined as follows:

```
Class module {
public:
    module(): _next(NULL) {}
    virtual initial() {}
```

```
        virtual LdNewState() {}
        virtual GenNewState() {}
        module *getNext() const {return __next;}
        void setNext(module *next) {__next=next;}
    private:
        __next;
    }
```

As shown above, the class module includes member functions initial(), LdNewStateol, GenNewState (), getNext (), and setNext(), and a private pointer __next. The private pointer __next allows module objects to be chained in a linked list. The member functions setNext() and getNext() are provided for inserting a new module and traversing the linked list, respectively. The constructor function module() initializes the private pointer __next to null, when the module is instantiated. The constructor function module can be provided, for example, by the source program segment:

```
        Static Module *GlobalModuleList;
    module: :module() {
            setNext(&GlobalModuleList);
            GlobalModuleList = this
        }
```

Here, a global module list GlobalModuleList is allocated in the simulator, and the constructor function module() automatically adds each module instantiated at the head of the global module list GlobalModuleList.

The member function initial() of a module provides an initial state of the logic circuit which the module represents. As mentioned above, the member function LdNewState() loads a new state into the state elements of the module. The member function GenNewState() generates the next state for the module to be loaded at the next execution of member function LdNewState().

Figure 3:
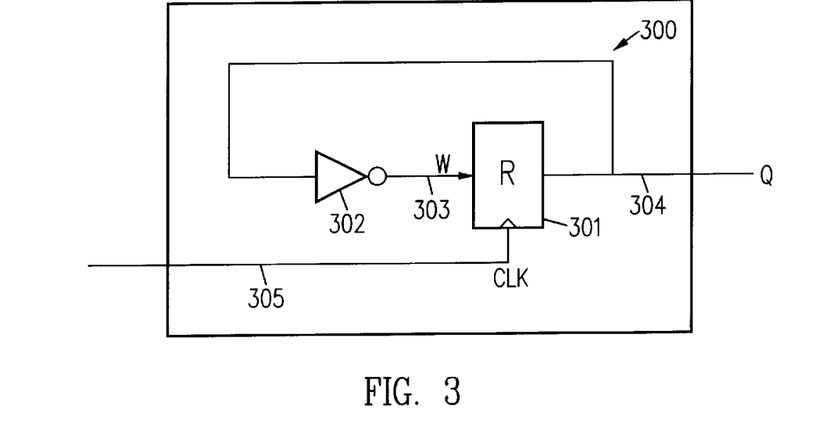
FIG. 3 shows a toggle flip-flop which serves as an example of how a module can be used under the present invention to create an RTL model.

In the present embodiment, a collection of modules form the basic building blocks for creating RTL models of logic circuit. FIG. 3 shows a toggle flip-flop which serves as an example of how a module can be used under the present invention to create an RTL model. As shown in FIG. 3, a toggle flip-flop 300 includes a register 301, which receives as an input signal a clock signal CLK at terminal 305, and provides as output a signal Q at terminal 304. The output signal Q at terminal 304 is fed back to an inverter 202, which outputs signal W at the input terminal 303 of register 301. An RTL model for toggle flip-flop 300 can be provided, in accordance with the present invention, as an object of the class TFF. In accordance with the present invention, class TFF is derived from the class module. The class TFF is declared as:

```
        Class TFF : public module {
            /* an input port and an output ports of
                the module */
            input CLK;
            output Q;
            // a state element
            Reg R;
            // a signal within the module
            Wire W;
            // initialization
            void initial() {R = 0};
            void LdNewState() {R = W};
            void GenNewSate() {Q = R; W = !Q}
        }
```

In class TFF, the data types Reg, Wire, input, and output are based on a common data type vector which is used to represent both individual signals and a group of signals in a circuit. These data types are declared as:

typedef vector reg;

typedef vector wire;

typedef const vector& input;

typedef vector& output;

The class vector is described in further detail below. The data type input is defined to be a "const", so as to explicitly set forth that such an input value cannot be changed by the module receiving the input value as an input signal. In the present embodiment, a C++ compiler provides an error message if, during type-checking, the compiler detects a signal of the data type input being modified by the recipient module. Debugging the RTL model is facilitated by this built-in type-checking capability of the object-oriented programming language. The data types input and output are provided as references to a vector object elsewhere. As will be shown below, the vector object referenced resides in a module which is higher in the model hierarchy and which contains the referencing module or modules.

In class TFF, the value in register R is set to zero upon initialization. When the next state is loaded, i.e. when member function LdNewState() is executed, the value in register R is copied from Wire object W, which is an input signal to register R. Member function GenNewState() then copies into the output signal Q the value of register R and updates the value of signal W by the complement of signal Q.

Figure 4:
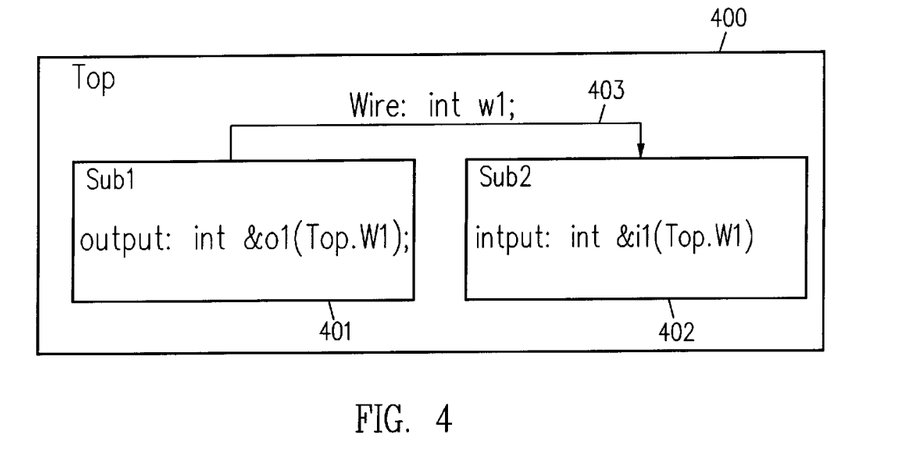
FIG. 4 is a simple hierarchical logic circuit 400 having two included logic circuits 401 and 402.

As mentioned above, under the present invention, the RTL model of a complex logic circuit can be hierarchical, i.e. the complex logic circuit's RTL model is created from RTL models of simpler logic circuits. FIG. 4 is a simple two-level logic circuit which illustrates hierarchical RTL models. As shown in FIG. 4, a simple two-level logic circuit 400 includes two simpler logic circuits 401 and 402. Circuit 401 is connected to circuit 402 by a single wire 403 carrying a signal w1. An RTL model of circuit 400 can be provided by the class Top, which is formed by two RTL models s1 and s2 of classes Sub1 (circuit 401) and Sub2 (circuit 402), respectively:

```
        Class Top: module {
            Top();
            Wire w1;
            Sub1 s1;
            Sub2 s2
        }
        Top: :top() : s1(w1), s2(w1) {}
        Class Sub1 : module {
            output o1;
            Sub1(output a1) : o1(a1) {}
        }
        Class Sub2 : module {
            input i1;
            Sub2(input b1) : i1(b1) {}
        }
```

More complex circuit can be built based on the principle of hierarchy. In this embodiment signals and buses are objects derived from the base class vector. An object of the class vector includes a private value __value. __value includes an integer holding the logic value of a single bit (a singular logic signal) or the logic values of the bits of a bus. A vector object can be (i) assigned, using the assignment operator =, (ii) tested for equality, using the equality operator ==, (iii) bit-wise negated, using the inverse operator !, and (iv) summed, using the summation operator +. In addition, any single bit of a vector object s can be extracted by the operator s(index). Similarly, a selected group of bits of a vector object s can be extracted by the operator s(msb, lsb), where msb and lsb are the most significant bit position and the least significant bit position of the bit values to be extracted, respectively. An object-oriented programming language, such as C++ allows signal objects such as those of the classes Wire, input and output, and state element type objects such as those of class Reg, to be manipulated in a manner, similar to that provided by the HDLs, which is familiar to those of ordinary skill in the art. To accomplish these operations, the class vector is declared as follows:

```
Class vector {
public:
    // constructor which initializes a
    // private variable __value
        vector(unsigned int value=0) :
            __value(value) {}
    // operator selecting a single bit
        bitselect operator() (unsigned int
        index) {
            return bitselect(*this, index)
        }
    // operator selecting a group of bits
        partselect operator() (unsigned int
        msb, unsigned int lsb) {
            return partselect(*this, msb,
            lsb)
        }
    // assignment operator
        vector operator==(vector value)
            {__value = value.__value;
            return *this}
    // equality operator
        int operator==(vector rhs)
            {return __value == rhs.value}
    // bit-wise negation operator
        vector operator!(vector rhs)
            {rhs.__value = !__value;
            return rhs}
    // bitselect, partselect functions and
    // the + operator declared elsewhere
        friend vector operator+(vector rhs,
            vector lhs);
        friend bitselect;
        friend partselect;
private:
    unsigned int __value
}
```

In the above declaration of the class vector, the summation operator, single bit selection operator and bit group selection operator are separately declared. The bit selection operator and bit group selection operator are declared using the classes bitselect and partselect. Declarations for vector operator +, and classes bitselect and partselect are provided as:

```
vector operator+(vector rhs, vector lhs) {
    return lhs.__value + rhs.__value
}
Class bitselect {
public:
    // constructor
        bitselect(vector &value, unsigned
            int index) : value(value),
            __index(index) { }
    // bit selection operator to vector
        operator vector( ) {
            return (__value.__value >> __index)
            & 0x1}
    // assignment to a selected bit
        vector &operator=(vector value) {
            unsigned int Value =
                (value.__value != 0) << __index;
            unsigned int mask = ~(1 <<
                __index);
            __value.__value = (__value.__value &
                mask) | Value;
            return value}
private:
    vector &__value;
    unsigned int __index
}
Class partselect {
public:
    // constructor
        partselect (vector &value,
            unsigned int msb,
            unsigned int lsb) :
                __value(value), __msb(msb),
                __lsb(lsb) { }
    // conversion operator to vector
        operator vector( ) {
            return (__value;__value >> __lsb) &
            BitMask__msb - __lsb] }
    // assignment operator
        vector &operator=(vector value) {
            unsigned int Value = value.__value
                & BitMas[__msb - __lsb];
            unsigned int Mask =
                ~(BitMask[__msb - __lsb] << __lsb);
            value.__value = (__value.__value &
                mask) | (Value << __lsb);
            return value}
private:
    vector &__value;
    unsigned int __msb;
    unsigned int __lsb
}
```

An RTL model of a complex logic circuit, such as a microprocessor, can be achieved using hierarchy and the signals and buses derived from the class vector, as discussed in the examples above. An RTL simulator can be achieved in conjunction with the RTL models created in the present invention, using the flow diagram 500 shown in FIG. 5.

Figure 5:
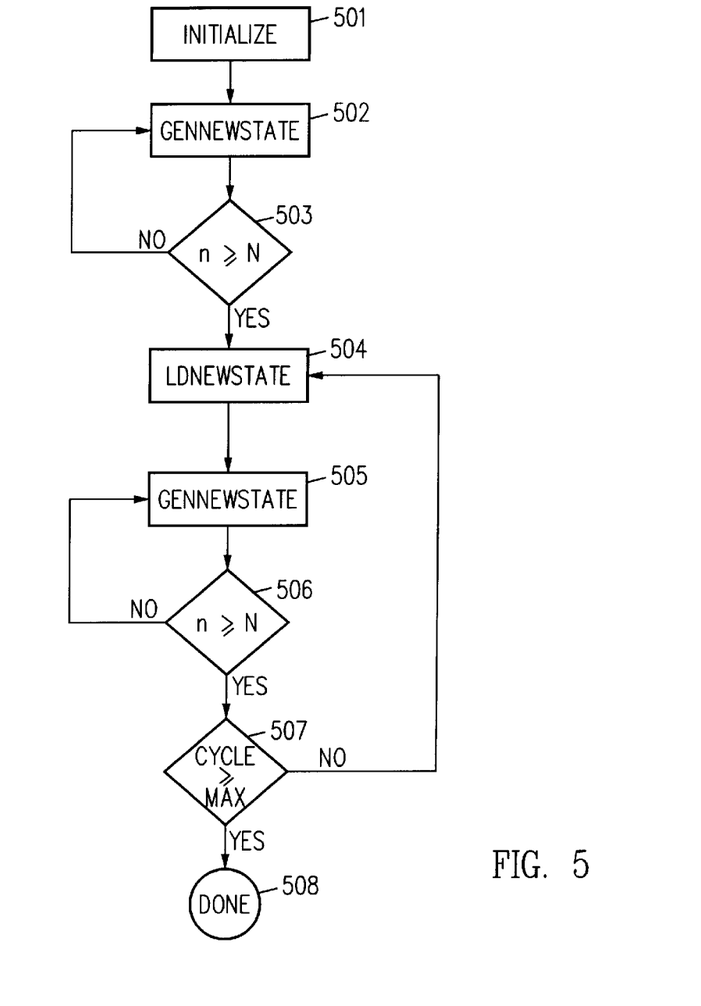
FIG. 5 is a flow diagram 500 suitable for implementing an RTL simulator of the present invention.

As discussed above, as each module is instantiated, it is inserted into a linked list GlobalModuleList. Thus, the linked list GlobalModuleList, upon initialization of an RTL model of a logic circuit, includes all modules of the RTL model of the logic circuit. As shown in FIG. 5, at step 501, the initial() member function of each module in the list GlobalModuleList is executed to initialize the internal state of each module of the RTL model. Then, to ensure that all modules of the RTL model are consistent with each other, at step 502, the GlobalModuleList list is traversed to invoke the member function GenNewState() to calculate a consistent initial state for the RTL model. Unless convergence is achieved, the input and output signals of a module may change each time the GenNewState function is executed. Thus, in the present embodiment, the GlobalModuleList list is traversed a predetermined number (N) of times (step 503)

to ensure that the RTL model converges into a consistent initial state. The number of necessary reiterations, i.e. necessary traversal through the GlobalModuleList, is selected empirically. In this embodiment, it is determined that traversing GlobalModuleList seven times is adequate. However, the number of reiterations necessary may vary from one RTL model to another.

Once a consistent initial state for the RTL model is achieved, simulation can begin. At step 504, the GlobalModuleList is traversed and the member function LdNewState() of each module is executed to inject an external test vector into the RTL model, and to load a new state into the state elements of each module. At step 505 and 506, the GlobalModuleList is again traversed for the predetermined number of times (N) to ensure convergence in the new states loaded. Execution of the steps 504, 505 and 506 represent one simulation period. The output signals of the RTL model are then recorded at step 507. If the simulation is not completed, i.e. the number of simulation cycles executed is less than a predetermined number of periods (MAX), the sequence of simulation steps 504, 505 and 506 is repeated for the remaining number of simulation cycles.

The algorithm of flow diagram 500 can be implemented by the following C++ program segment:

```
void simulate( ) {
    const int n = NO_OF_ITERATIONS_TO_CONVERGENCE;
    const int m = MAX_NO_OF_SIMULATION_CYCLES;
    module *ptr = GlobalModuleList;
    while (ptr) {
        ptr->initial( );
        ptr = ptr->getNext( )
    }
    for (int i=0; i < n; ++i) {
        ptr = GlobalModuleList;
        while (ptr) {
            ptr->GenNewState( );
            ptr = ptr->getNext( )
        }
    }
    for (int j=0; j < m; ++j) {
        ptr = GlobalModuleList;
        while (ptr) {
            ptr->LdNewState ( );
            ptr = ptr->getNext( )
        }
        for (int i=0; i < n; ++i) {
            ptr = GlobalModuleList;
            while (ptr) {
                ptr->GenNewState ( );
                ptr = ptr->getNext( )
            }
        }
    }
}
```

Figure 6:
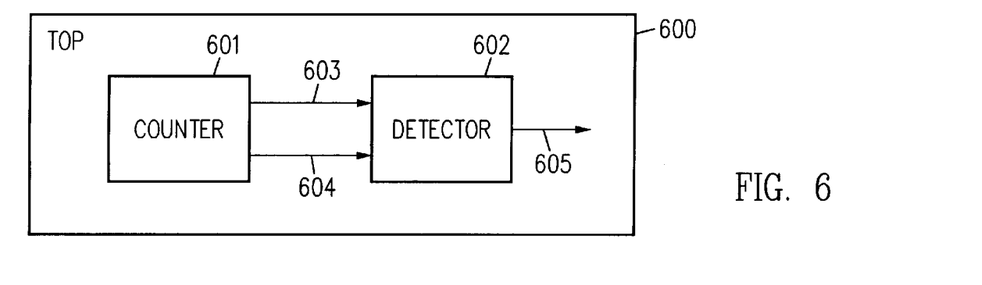
FIG. 6 shows a logic circuit 600, which is used to further illustrate, by way of an example, the RTL model and the simulator described above.

FIG. 6 shows a logic circuit 600, which is used to further illustrate, by way of example, the RTL model and the simulator described above. As shown in FIG. 6, a top level circuit 600 includes a 4-bit counter 601 and a detector circuit 602. Counter 601 provides two output signals clock_2_7_11 and clock_1_7_10 at terminals 603 and 604. Signal clock_2_7_11 is asserted when the count in counter 601 takes the value 2, 7, or 11. Similarly, signal clock_1_7_10 is asserted when the count in counter 601 takes the value 1, 7 or 10. Signals clock_2_7_11 and clock_1_7_10 at terminals 603 and 604 are received as input signals by detector circuit 602. Detector circuit 602 provides a single output signal detector_out at terminal 605.

The following C++ program segments provides the RTL models for top circuit 600, counter 601 and detector 602:

```
Class top : public module {
    top( );
    Wire clock_1_7_10;
    Wire clock_2_7_11;
    Wire detector_out;
    Counter counter1;
    Detector detector1
}
Class Counter : public module {
    Counter(output o1, output o2);
    output clock_1_7_10;
    output clock_2_7_11;
    Reg r;
    void initial( );
    void LdNewState( );
    void GenNewState( )
}
Class Detector : public module {
    Detector(input i1, input i2, output o1);
    input clock_1_7_10;
    input clock_2_7_11;
    output detector_out;
    void initial( );
    void LdNewState( );
    void GenNewState( )
}
top::top( ) : counter1(clock_1_7_10, clock_2_7_10),
        detector1(clock_1_7_10, clock_2_7_10,
            detector_out) { }
Counter::Counter(output o1, output o2) :
        clock_1_7_10(o1), clock_2_7_11(o2) { }
void Counter::initial( ) {
    r(3,0) = 0}
void Counter::LdNewState( ) {
    r(3,0) = r(3,0) + 1}
void Counter::GenNewState( ) {
    clock_1_7_10 = (r==1) || (r==7) || (r==10);
    clock_2_7_11 = (r==2) || (r==7) || r==11)}
void Detector::Detector(input i1, input i2,
        output o1) : clock_1_7_10(i1),
            clock_2_7_11(i2), detector_out(o1) { }
void Detector::GenNewState( ) {
    detector_out = clock_1_7_10 && clock_2_7_11}
```

In the above example, the assignments to the bits r(3,0) of register r implicitly invoke the partselect() member function of the partselect class. A LdNewState() member function is not explicitly provided for the class Detector, since no state (Reg) element is defined for the Detector class. The GenNewState member function for the Detector class computes the value of output Signal detector_out.

The present invention is applicable to the design of such computer systems as those described in the following copending U.S. patent applications, which are hereby incorporated into the present patent application by reference:

1. U.S. patent application, entitled "Unified Multifunction Operation Scheduler for Out-of-order Execution in a Superscaler Processor", by John G. Favor et al., Ser. No. 08/590,383, filed on the same day as the present application, assigned to NexGen Microsystems, Inc., now abandoned.

2. U.S. patent application, entitled "Out-of-order Processing with Operation Bumping to Reduce Pipeline Delay", by John G. Favor et al., Ser. No. 08/590,568, filed on the same day as the present application, assigned to NexGen Microsystems, Inc., now abandoned.

3. U.S. patent application, entitled "Scan Chain for Rapidly Identifying First or Second Objects of Selected Types in a Sequential List", by John G. Favor et al., Ser. No. 08/592,722, filed on the same day as the present application, assigned to NexGen Microsystems, Inc., now U.S. Pat. No. 5,745,724 issued on Apr. 28, 1998.

4. U.S. patent application, entitled "Self-Modifying Code Handling System", by Amos Ben-Meir et al., Ser. No.

08/592,150, filed on the same day as the present application, assigned to NexGen Microsystems, Inc., now U.S. Pat. No. 5,826,073 issued on Oct. 20, 1998.

5. U.S. patent application, entitled "Out-of-order Load/Store Execution Control", by John G. Favor et al., Ser. No. 08/592,209, filed on the same day as the present application, assigned to NexGen Microsystems, now U.S. Pat. No. 5,754,812 issued on May 19, 1998.

6. U.S. patent application, entitled "Two Way Encoding Branching Method and System", by John G. Favor et al., Ser. No. 08, /592,210, filed on the same day as the present application, assigned to NexGen Microsystems, Inc., now abandoned.

7. U.S. patent application, entitled "Instruction Vectoring and Decode", by John G. Favor et al., Ser. No. 08/592,208, filed on the same day as the present application, assigned to NexGen Microsystems, Inc., now abandoned.

8. U.S. patent application, entitled "RISC 86 Instruction Set", by John G. Favor et al., Ser. No. 08/592,151, filed on the same day as the present application, assigned to NexGen Microsystems, Inc., now abandoned.

9. U.S. patent application, entitled "Software Implementation of SMM", by John G. Favor et al., Ser. No. 08/592,149, filed on the same day as the present application, assigned to NexGen Microsystems, Inc., now abandoned.

10. U.S. patent application, entitled "Method For Simulating Cache Operation", by Warren G. Stapleton, Ser. No. 08/592,829, filed on the same day as the present application, assigned to NexGen Microsystems, Inc., now U.S. Pat. No. 845,106 issued on Dec. 1, 1998.

11. U.S. patent application, entitled "Method for Analyzing Performance of a Microprocessor", by Warren G. Stapleton, Ser. No. 08/592,828, filed on the same day as the present application, assigned to NexGen Microsystems, Inc., now U.S. Pant. No. 5,886,899 issued on Mar. 23, 1999.

12. U.S. patent application, entitled "Instruction Predecode and Multiple Instruction Decode", by John G. Fervor et al, Ser. No. 08/592,207, filed on the same day as the present application, assigned to NexGen Microsystems, Inc., now abandoned.

13. U.S. patent application, entitled "Instruction Buffer Organization Method and System", by John G. Fervor et al, Ser. No. 08/593,765, filed on the same day as the present application, assigned to NexGen Microsystems, Inc., now abandoned.

The detailed description above is provided to illustrate the specific embodiments of the present invention and is not intended to be limiting. Numerous variations and modifications within the scope of the present invention are possible. The present invention is defined by the appended claims.

```
#include <assert.h>
#include <stdio.h>
#include <stdlib.h>
#include <unistd.h>
#include <stdio.h>
#include <sys/wait.h>
#include <sys/types.h>
#include <sys/socket.h>
#include "veriuser.h"
#include "acc_user.h"
#include "socketmsg.h"
/*************************************************************/
int socket_read(fd, ptr, nbytes)
/*************************************************************/
int fd; char *ptr: int nbytes;
{
    int nleft, nread:
    nleft = nbytes;
    while(nleft > 0) {
        nread = read(fd, ptr, nleft);
        if(nread < 0)
            return nread;
        else if (nread == 0)
            break;
        nleft -= nread;
        ptr += nread;
    }
    return nbytes - nleft;
}
/*************************************************************/
int socket_readstring(fd, ptr, maxlen)
/*************************************************************/
    int fd; char *ptr; int maxlen;
{
    int n, rc;
    char c;
    for(n=1; n < maxlen; ++n) {
        if((rc = read(fd, &c, 1)) == 1) {
            *ptr++ = c;
            if(c=='\0'))
                break;
        } else if(rc == 0) {
            if(n==1)
                return 0;
            else
                break;
        } else
            return -1;
```

-continued

```
        }
        *ptr = 0;
        return n;
}
/*************************************************************************/
int socket_write(fd, ptr, nbytes)
/*************************************************************************/
        int fd; char *ptr; int nbytes;
{
        int nleft, nwritten;
        nleft = nbytes;
        while(nleft > 0) {
             nwritten = write(fd, ptr, nleft);
             if(nwritten <= 0)
                  return nwritten;
             nleft -= nwritten;
             ptr += nwritten;
        }
        return nbytes - nleft;
}
static int sockfd = 0;
/*************************************************************************/
int h86_pipestart_calltf( ) {
/*************************************************************************/
        int rc, sockvec[2];
        int childpid;
        char socketnumber[30];
        /* create connected socketpair */
        rc = socketpair(AF_UNIX, SOCK_STREAM, 0, sockvec);
        /* fork off child process */
        if((childpid = fork( )) == -1) {
             io_printf("cant fork pipe process\n");
             exit (1);
        } else if(childpid == 0) {
             /* close unused end of socket */
             close(Sockvec)[1]);
             /* exec pipeline model passing socket number through args */
             sprintf(socketnumber, "SOCKETNUMBER=%d", sockvec[0]);
             execlp("/h86/bin/pipe", "pipe", "SOCKET=OH", socketnumber, "intp2", NULL);
        { else { /* parent process */
             /* close unused end of socket */
             close (sockvec[0]);
             sockfed = sockvec[1];
             io_printf("$h86_PipeStart: process pid=%d\n", childpid);
        }
        return 0;
}
/*************************************************************************/
int h86_pipeiterate_calltf( ) {
/*************************************************************************/
        VPReqMsg ReqMsg;
        VPAckMsg AckMsg;
        /* send req */
/* io_printf("$h86_PipeIterate: sending doOneChpCycle request\n");*/
        ReqMsg.Type = VP_DO_ONE_CHP_CYCLE;
        socket_write(sockfd, (char *)&ReqMsg, sizeof(ReqMsg));
        /* wait for acknowledge */
/* io_printf("$h86_PipeIterate: waiting for acknowledge\n");*/
        socket_read(sockfd, (char *)&AckMsg, sizeof(AckMsg));
/* io_printf("$h86_PipeIterate: received message with type = %d\n", AckMsg.Type);*/
}
/*************************************************************************/
int h86_pipesetchpio_calltf( ) {
/*************************************************************************/
        int position;
        VPSetChpIOMsg SetChpIOMsg;
        VPAckMsg AckMsg;
        VPReqMsg ReqMsg;
        if(tf_nump( ) !=62)
             io_printf("wrong number of arguments to $h86_PipeSetChpIO %d\n", tf_nump( ));
        /* send req */
/* io_printf("$h86_PipeSetChpIO: sending request for data\n");*/
        ReqMsg.Type = VP_SET_CHPIO;
        socket_write(sockfd, (char *)&ReqMsg, sizeof(ReqMsg));
        /* wait for acknowledge */
/* io_printf("$h86_PipeSetChpIO: waiting for acknowledge to request\n");*/
        socket_read(sockfed, (char *)AckMsg, sizeof(AckMsg));
/* io_printf("$h86_PipeSetChpIO: received message with type = %d\n", AckMsg.Type);*/
        /* set up data to send */
```

-continued

```
position = 1;
SetChpIOMsg.IO_BCLK = tf_getp(position++);
SetChpIOMsg.PAD_ADS = tf_getp(position++);
SetChpIOMsg.PAD_AD1 = tf_getp(position++);
SetChpIOMsg.PAD_AD2 = tf_getp(position++);
SetChpIOMsg.PAD_AD3 = tf_getp(position++);
SetChpIOMsg.PAD_AD4 = tf_getp(position++);
SetChpIOMsg.PAD_AD5 = tf_getp(position++);
SetChpIOMsg.PAD_AD6 = tf_getp(position++);
SetChpIOMsg.PAD_AD7 = tf_getp(position++);
SetChpIOMsg.PAD_CDATA0 = tf_getp(position++);
SetChpIOMsg.PAD_CDATA1 = tf_getp(position++);
SetChpIOMsg.PAD_CDATA2 = tf_getp(position++);
SetChpIOMsg.PAD_CDATA3 = tf_getp(position++);
SetChpIOMsg.PAD_CDATA4 = tf_getp(position++);
SetChpIOMsg.PAD_CDATA5 = tf_getp(position++);
SetChpIOMsg.PAD_CDATA6 = tf_getp(position++);
SetChpIOMsg.PAD_CDATA7 = tf_getp(position++);
SetChpIOMsg.PAD_CLK = tf_getp(position++);
SetChpIOMsg.PAD_CTAG = tf_getp(position++);
SetChpIOMsg.PAD_DBGFRZRAM = tf_getp(position++);
SetChpIOMsg.PAD_EXTRESET = tf_getp(position++);
SetChpIOMsg.PAD_FLOAT = tf_getp(position++);
SetChpIOMsg.PAD_GALE = tf_getp(position++);
SetChpIOMsg.PAD_GATEA20 = tf_getp(position++);
SetChpIOMsg.PAD_GBLKNBL = tf_getp(position++);
SetChpIOMsg.PAD_GDCL = tf_getp(position++);
SetChpIOMsg.PAD_GNT_ = tf_getp(position++);
SetChpIOMsg;PAD_GSHARE = tf_getp(position++);
SetChpIOMsg.PAD_GTAL = tf_getp(position++);
SetChpIOMsg.PAD_GXACK = tf_getp(position++);
SetChpIOMsg.PAD_INTR_ = tf_getp(position++);
SetChpIOMsg.PAD_PLLSEL_ = tf_getp(position++);
SetChpIOMsg.PAD_LTEST = tf_getp(position++);
SetChpIOMsg.PAD_NB3X = tf_getp(position++);
SetChpIOMsg.PAD_NMI_ = tf_getp(position++);
SetChpIOMsg.PAD_NPDATA0 = tf_getp(position++);
SetChpIOMsg.PAD_NPDATA1 = tf_getp(position++);
SetChpIOMsg.PAD_NPDATA2 = tf_getp(position++);
SetChpIOMsg.PAD_NPDATA3 = tf_getp(position++);
SetChpIOMsg.PAD_NPDATA4 = tf_getp(position++);
SetChpIOMsg.PAD_NPDATA5 = tf_getp(position++);
SetChpIOMsg.PAD_NPDATA6 = tf_getp(position++);
SetChpIOMsg.PAD_NPDATA7 = tf_getp(position++);
SetChpIOMsg.PAD_NPNOERR = tf_getp(position++);
SetChpIOMsg.PAD_NPTERM = tf_getp(position++);
SetChpIOMsg.PAD_NPWREQ = tf_getp(position++);
SetChpIOMsg.PAD_NPWVAL = tf_getp(position++);
SetChpIOMsg.PAD_OLDNBORDER = tf_getp(position++);
SetChpIOMsg.PAD_OWNABL = tf_getp(position++);
SetChpIOMsg.PAD_OE = tf_getp(position++);
SetChpIOMsg.PAD_CSOUT_ = tf_getp(position++);
SetChpIOMsg.PAD_XCLK = tf_getp(position++);
```

I claim:

1. A method for comparing the output signals of a register transfer level (RTL) model simulation of a logic circuit and the output signals of a hardware description language (HDL) model simulation of the logic circuit, comprising the steps:

starting said RTL model simulation of said logic circuit and said HDL model simulation of said logic circuit in a first process and a second process, respectively, of an operating system supporting an interprocess communication mechanism; and repeating the following steps until a predetermined number of simulation cycles are completed:

(i) running said RTL model simulation for a predetermined simulation time period using an input test vector;

(ii) retrieving, at the end of said predetermined simulation time period, values of output signals of said RTL model;

(iii) sending to said second process, through said interprocess communication mechanism, said output values of said RTL model;

(iv) running said HDL model simulation for said predetermined simulation period using said input test vector;

(v) retrieving, at the end of said predetermined simulation time period, values of output signals of said HDL model; and (vi) comparing, at the end of said predetermined simulation time period, whether or not said values of said output signals of said RTL model equal said output values of said output signals of said HDL model.

2. A method as in claim 1, wherein said operating system is a UNIX-type operating system and said interprocess communication mechanism comprises sockets.

3. A method as in claim 1, wherein said RTL model comprises objects represented in an object-oriented programming language.

* * * * *